United States Patent
Cha et al.

(10) Patent No.: US 7,576,415 B2
(45) Date of Patent: Aug. 18, 2009

(54) EMI SHIELDED SEMICONDUCTOR PACKAGE

(75) Inventors: Sang Jin Cha, Kyunggi-do (KR); Hyeongno Kim, Kyunggi-do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 245 days.

(21) Appl. No.: 11/763,858

(22) Filed: Jun. 15, 2007

(65) Prior Publication Data

US 2008/0308912 A1    Dec. 18, 2008

(51) Int. Cl.
*H01L 23/552*    (2006.01)
(52) U.S. Cl. ...................... 257/659; 257/660
(58) Field of Classification Search ................. 257/659, 257/660
See application file for complete search history.

(56) References Cited

U.S. PATENT DOCUMENTS

| 6,614,102 | B1 | 9/2003 | Hoffman et al. |
| 6,740,959 | B2 * | 5/2004 | Alcoe et al. .................. 257/659 |
| 6,781,231 | B2 | 8/2004 | Minervini |
| 6,865,084 | B2 * | 3/2005 | Lin et al. ..................... 361/704 |
| 7,030,469 | B2 | 4/2006 | Mahadevan et al. |
| 2004/0150097 | A1 * | 8/2004 | Gaynes et al. .............. 257/704 |

* cited by examiner

*Primary Examiner*—Douglas M Menz

(57) ABSTRACT

An EMI shielded semiconductor package is provided. The package includes a substrate and a chip disposed on the substrate. The chip is electrically connected to the substrate by a plurality of bonding wires. At least one shielding conductive block is formed on the substrate and electrically connected to the ground trace of the substrate. A sealant is formed on the substrate and covers the chip, bonding wires and the shielding conductive block. The sealant has a side surface to expose a surface of the shielding conductive block. A layer of conductive film is formed on the outer surface of the sealant and covers the exposed surface of the shielding conductive block thereby shielding the chip from electromagnetic interference.

9 Claims, 5 Drawing Sheets

EMI SHIELDED SEMICONDUCTOR PACKAGE

BACKGROUND OF THE INVENTION

1. Field of the Invention

The invention relates to a semiconductor package, and more particularly, to a radiation-shielded semiconductor package.

2. Description of the Related Art

As known in the art, radio frequency (RF) packages are sensitive to electromagnetic interference (EMI). It is therefore required to pay more attention to the crosstalk between RF packages when these RF packages are arranged on a printed circuit board.

Referring to FIG. 1, U.S. Pat. No. 6,781,231 discloses a semiconductor package 100 that includes a substrate 110 and a chip 120 disposed thereon. A cover 130 is disposed on the substrate 110 to cover the chip 120. A peripheral edge of the cover 130 is electrically connected the substrate 110 by a conductive adhesive, solder, or the like 140. The cover 130 is produced from an outer cup 132a formed from a conductive layer of material such as copper, stainless steel, aluminum, or an alloy thereof. The cover 130 further includes an inner cup 132b. The inner cup 132b is also produced from a conductive layer. An inner lining 150 is formed on the inner cup 132b. The inner lining 150 is primarily formed by conductive material. The inner lining 150 protects the chip 120 from electromagnetic interference.

The above-mentioned package has the advantage of being able to shield the chip therein from external electromagnetic interference. However, it is laborious to produce such a package.

In addition, referring to FIG. 2, U.S. Pat. No. 6,614,102 discloses another semiconductor package 10 that includes a die pad 14, a chip 12 disposed on the die pad 14 and a set of leads 16 surrounding the die pad 14, wherein the chip 12 is electrically connected to the leads 16 by bonding wires 18. In order to shield the chip 12 from electromagnetic interference, a shield element 24 is used to cover the chip 12. The shield element 24 is connected to selected leads 16, and is grounded to provide an effective electromagnetic interference shield. In order to protect the chip 12, a sealant 22 is used to encapsulate the chip 12 and bonding wire 18 to protect these elements from damage.

The above-mentioned package also has the advantage of being able to shield the chip therein from external electromagnetic interference. However, it is still required to include an additional shield element in the package. This will increase the production cost and complexity of production.

Accordingly, there exists a need to provide an EMI shielded semiconductor package to solve the above-mentioned problems.

SUMMARY OF THE INVENTION

It is an object of the present invention to provide an EMI shielded semiconductor package that can shield the chip therein from external electromagnetic interference.

In order to achieve the above object, the EMI shielded semiconductor package of the present invention includes a substrate with a chip disposed thereon. The chip is electrically connected to the substrate by a plurality of bonding wires. At least one shielding conductive block is formed on the substrate and electrically connected to the ground trace of the substrate. A sealant is formed on the substrate and covers the chip, bonding wires and shielding conductive block. The sealant has a side surface to expose a surface of the shielding conductive block. A layer of conductive film is formed on the outer surface of the sealant and covers the exposed surface of the shielding conductive block to electrically connect to the shielding conductive block. Since the conductive film overlays the sealant and is electrically connected to the ground trace of the substrate through the shielding conductive block, the conductive film is therefore capable of shielding the chip in the package from electromagnetic interference.

It is another object of the present invention to provide the method for manufacturing the EMI shielded semiconductor package.

In order to achieve the above object, a substrate strip including a plurality of substrate units is provided. These substrate units are separated from each other by a plurality of saw streets. A plurality of chips is respectively mounted to the substrate units. The chips are wire-bonded to the substrate units on which the chips are disposed by a plurality of bonding wires. A plurality of shielding conductive blocks is formed across the saw streets of the substrate strip to electrically connect the ground trace of one substrate unit to that of the adjacent one. Afterward, a continuous sealant is formed on the substrate strip to encapsulate the chips, bonding wires and shielding conductive blocks. The continuous sealant is cut into a plurality of separated sealants while the substrate strip remains uncut. A layer of conductive film is then formed on the separated sealants and electrically connected to the surfaces of the shielding conductive blocks exposed out of the separated sealants after being cut. Finally, the substrate strip is full-cut to obtain the EMI shielded semiconductor packages of the present invention.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 4a to 4g illustrate the method for manufacturing the EMI shield semiconductor package of the present invention, wherein FIG. 4c is a top view of the package shown in FIG. 4b.

DETAILED DESCRIPTION OF THE PREFERRED EMBODIMENT

Figure 1:
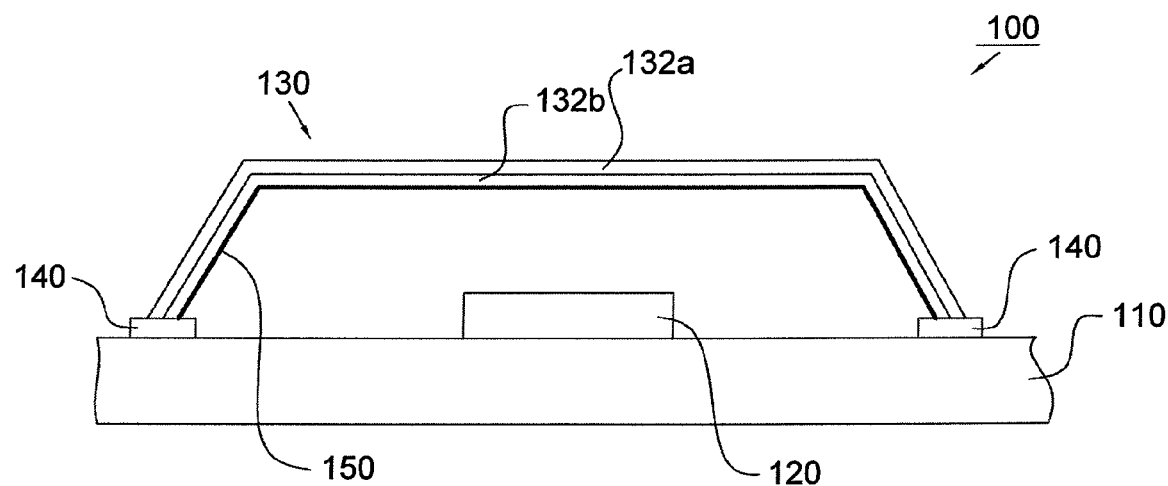
FIG. 1 is a cross-sectional view of a conventional EMI shielded semiconductor package.
Figure 2:
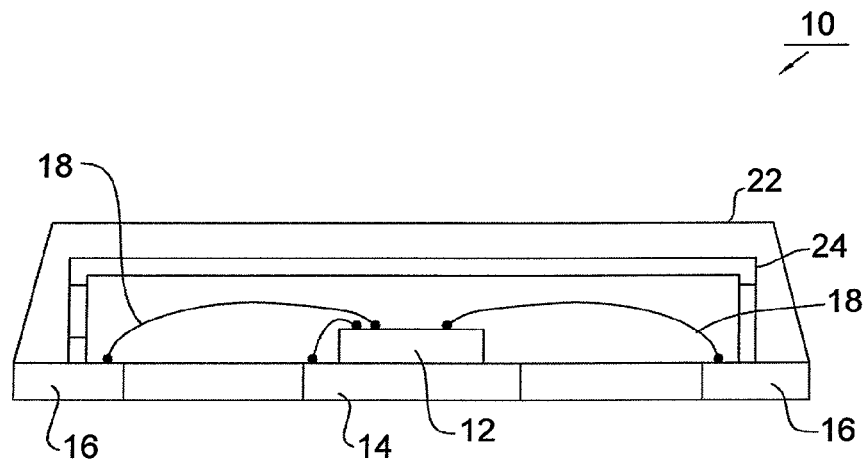
FIG. 2 is a cross-sectional view of another conventional EMI shielded semiconductor package.
Figure 3:
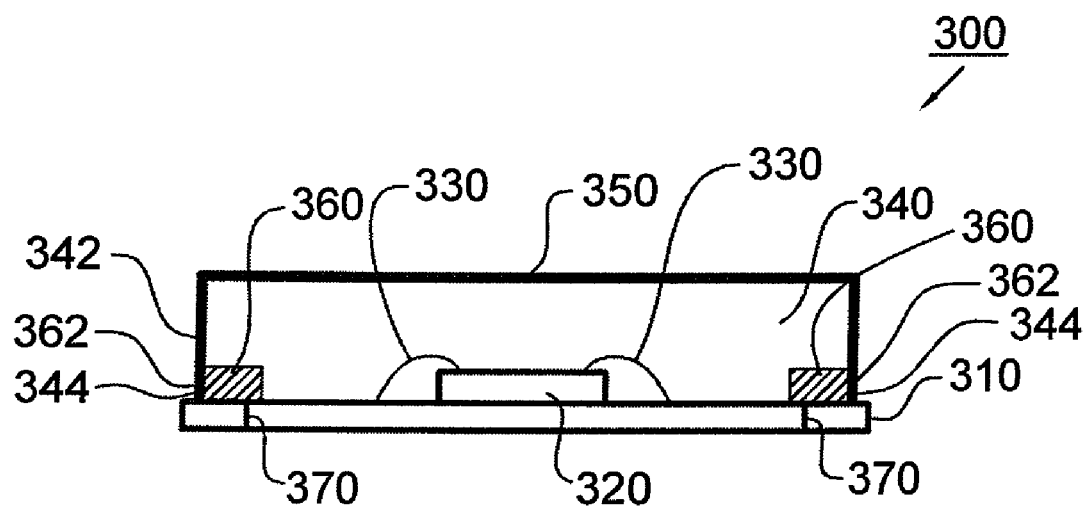
FIG. 3 is a cross-sectional view of an EMI shielded semiconductor package of the present invention.

Referring to FIG. 3, an EMI shielded semiconductor package 300 of the present invention includes a substrate 310 and a chip 320 such as RF function chip or MEMS chip disposed on the substrate 310. The chip 320 is electrically connected to the substrate 310 by e.g. a plurality of bonding wires 330. At least one shielding conductive block 360 made of such as solder paste or conductive epoxy is formed on the substrate 310 and electrically connected to the ground trace 370 of the substrate 310. A sealant 340 is formed on the substrate 310 and covers the chip 320, bonding wires 330 and shielding conductive block 360. The sealant 340 has a side surface 344 to expose a surface 362 of the shielding conductive block 360.

In order to shield the chip 320 from electromagnetic interference, a layer of conductive film 350 made of such as aluminum (Al), copper (Cu), chromium (Cr), stannum (Sn), gold (Au), silver (Ag), nickel (Ni) or any combination thereof is formed on the outer surface 342 of the sealant 340 and covers the exposed surface 362 of the shielding conductive block 360 to electrically connect to the shielding conductive block 360. Since the conductive film 350 overlays the sealant 340 and is electrically connected to the ground trace 370 of the substrate 310 through the shielding conductive block 360, the conductive film 350 is therefore capable of shielding the chip 320 from electromagnetic interference. In addition, since the shielding conductive block 360 has a certain thickness, it is therefore also capable of shielding surrounding devices from electromagnetic interference.

Figure 4A:
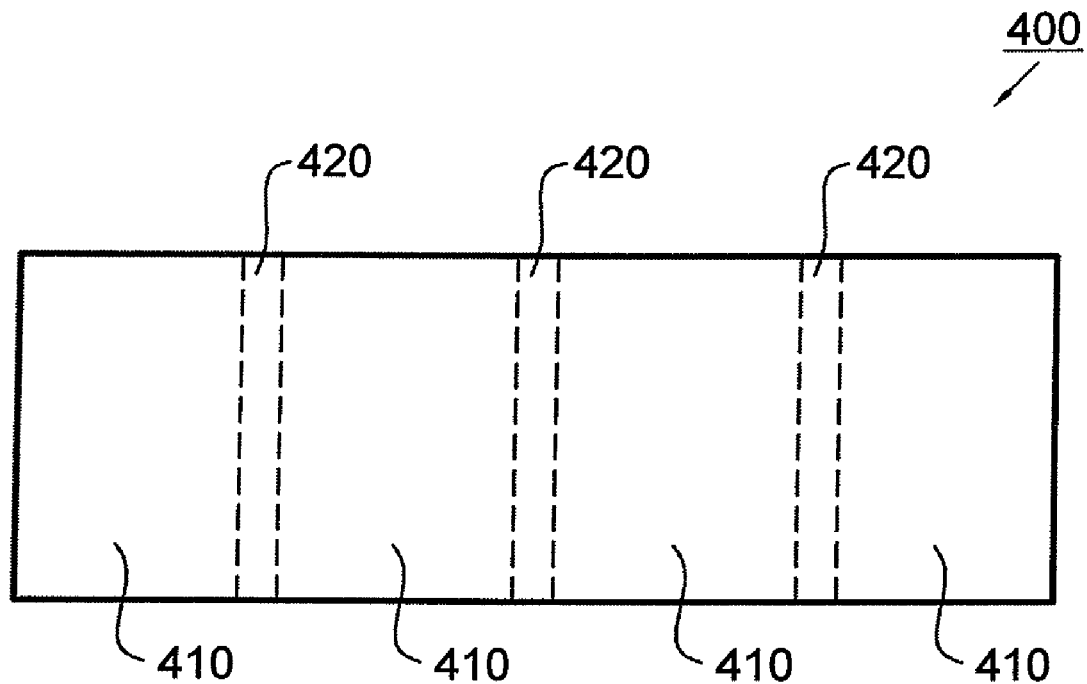
Figure 4B:
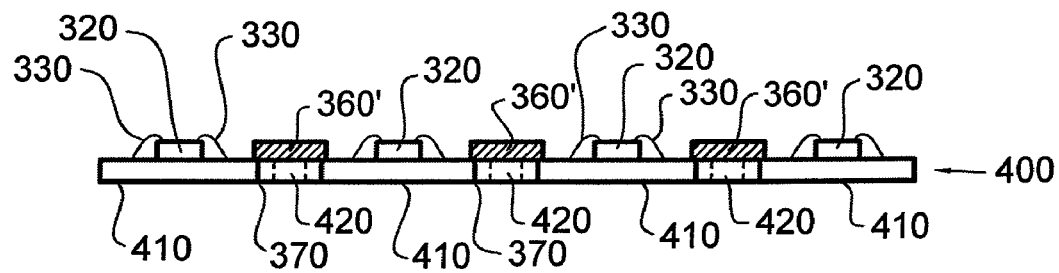
Figure 4C:
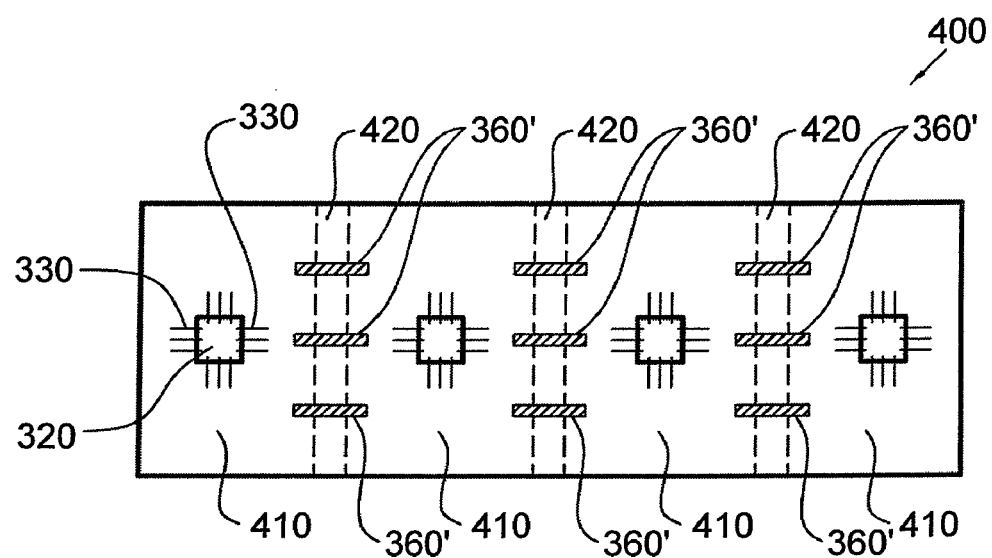

Referring to FIGS. 4a to 4g, the method for manufacturing the EMI shielded semiconductor package 300 of the present invention is provided. First, referring to FIG. 4a, a substrate strip 400 including a plurality of substrate units 410 is provided. These substrate units 410 are separated from each other by a plurality of saw streets 420. The saw street 420 has a width of about 0.5 mm. Referring to FIG. 4b, a plurality of chips 320 is respectively mounted to the substrate units 410. The chips 320 are wire-bonded to the substrate units 410 on which the chips 320 are disposed by a plurality of bonding wires 330. A plurality of shielding conductive blocks 360' is formed across the saw streets 420 of the substrate strip 400 to electrically connect the ground trace 370 of one substrate unit 410 to that of the adjacent one (see FIG. 4c). Afterward, referring to FIG. 4d, a continuous sealant 440 is formed on the substrate strip 400 to encapsulate the chips 320, bonding wires 330 and shielding conductive blocks 360'.

Figure 4D:
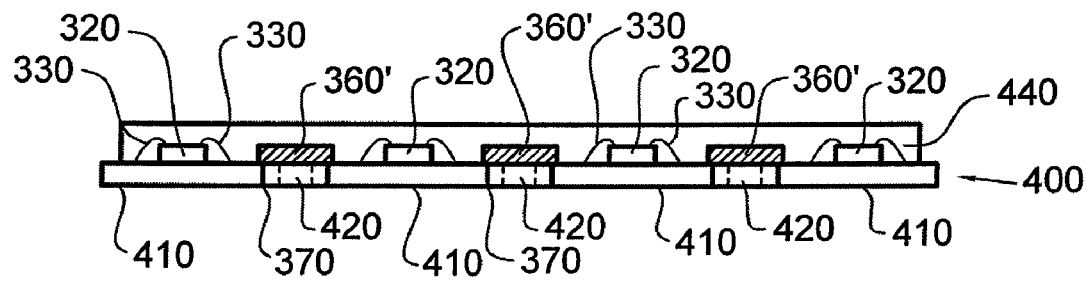
Figure 4E:
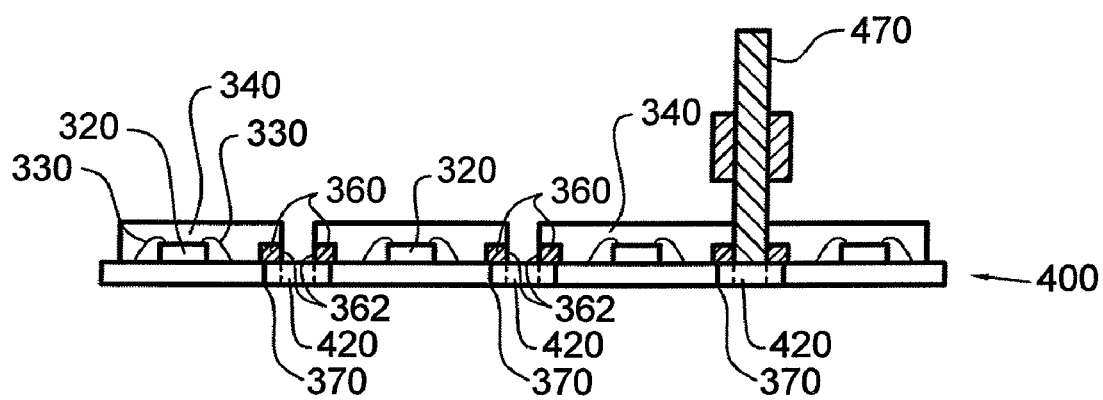
Figure 4F:
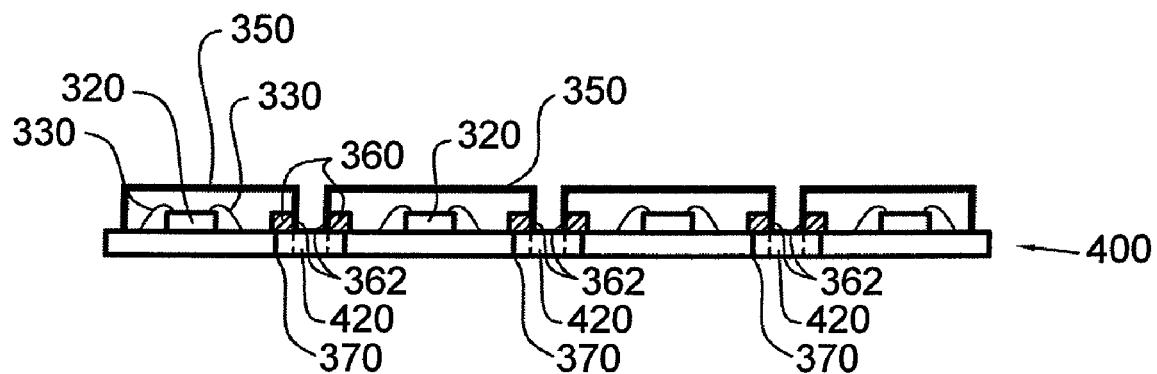
Figure 4G:
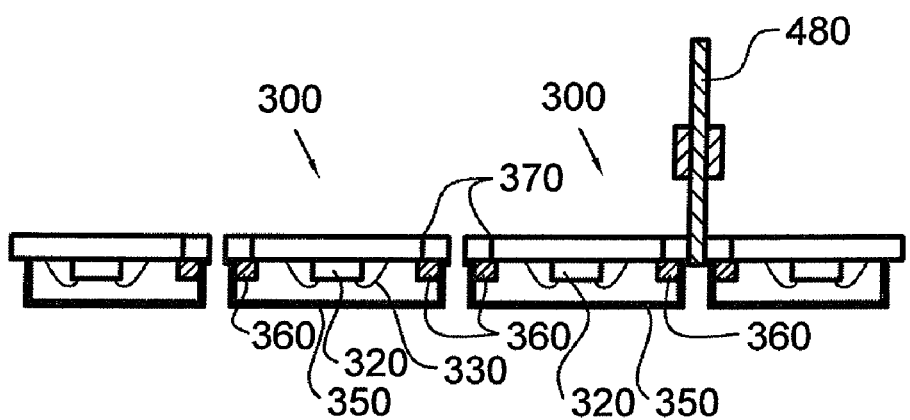

Referring to FIG. 4e, to singulate the substrate units 410 from each other, the package shown in FIG. 4d is first half-cut along the saw streets 420 with a saw blade 470 having a thickness substantially equal to the width of the saw streets 420. The continuous sealant 440 is cut into a plurality of separated sealants 340 while the substrate strip 400 remains uncut. After the continuous sealant 440 is cut, each shielding conductive block 360' originally embedded in the continuous sealant 440 is also cut into two halves 360 and each of which has a surface 362 exposed out of the separated sealants 340. Afterward, referring to FIG. 4f, a layer of conductive film 350 is formed on the sealants 340 by chemical vapor deposition, electroless plating, electrolytic plating, spray coating, printing or sputtering and covers the exposed surfaces 362 of the shielding conductive blocks 360. Referring to FIG. 4g, after the conductive film 350 is formed on the sealants 340, the package shown in FIG. 4f is turned over with the substrate strip 400 faced up and the sealants 340 faced down. A saw blade 480 is used to full-cut the substrate strip 400 to obtain the EMI shielded semiconductor packages 300 of the present invention. The saw blade 480 has a thickness preferably smaller than that of the saw blade 470, said 0.3 mm.

The material for forming the shielding conductive blocks 360' can be such as solder paste or conductive epoxy. In the step of forming the shielding conductive blocks 360', the solder paste or conductive epoxy is first applied to the substrate strip 400. Afterward the solder paste or conductive epoxy is reflowed or cured to form the shielding conductive blocks 360. Moreover, the way to electrically connect the chip to the substrate is not limited to the wire-bonding. The chip can also be attached to the substrate by flip-chip process in the present invention.

The method for manufacturing the EMI shielded semiconductor package 300 of the present invention is to form a conductive film 350 on the sealant 340 of the package 300. The conductive film 350 will be able to function as a shield element when the conductive film 350 is grounded. Therefore, there is no need to mount an additional shield element for shielding the package 300 from electromagnetic interference. Furthermore, the conductive film 350 can be formed on a larger number of packages 300 at a time. This will be beneficial for reducing the production cost.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package, comprising:
   a substrate having a ground trace;
   a chip disposed on the substrate;
   at least one shielding conductive block formed on the substrate and electrically connected to the ground trace;
   a sealant formed on the substrate and covering the chip and shielding conductive block, the sealant having a side surface to expose a surface of the shielding conductive block; and
   a conductive film formed on the outer surface of the sealant and covering the exposed shielding conductive block to electrically connect to the shielding conductive block.

2. The semiconductor package as claimed in claim 1, further comprising:
   a plurality of bonding wires electrically connecting the chip to the substrate.

3. The semiconductor package as claimed in claim 1, wherein the conductive film is made of a material selected from the group consisting of aluminum, copper, chromium, stannum, gold, silver and nickel.

4. The semiconductor package as claimed in claim 1, wherein the shielding conductive block is made of a material selected from the group consisting of solder paste and conductive epoxy.

5. A method for manufacturing a semiconductor package, comprising the steps of:
   providing a substrate strip comprising a plurality of substrate units, wherein the substrate units are separated from each other by a plurality of saw streets, each of the substrate units has a ground trace;
   disposing a plurality of chips on the substrate units;
   forming a plurality of shielding conductive blocks across the saw streets of the substrate strip and electrically connecting the shielding conductive blocks to the ground traces;
   forming a continuous sealant on the substrate strip to encapsulate the chips and shielding conductive blocks;
   cutting the continuous sealant along the saw streets to form a plurality of separated sealants and to have each of the shielding conductive blocks divided into two halves, wherein each of the separated shielding conductive blocks has a surface exposed out of the separated sealant;
   forming a layer of conductive film on the outer surfaces of the sealants to cover the exposed surfaces of the shielding conductive blocks so as to electrically connect the conductive film to the separated shielding conductive blocks; and
   cutting the substrate strip to fully separate the substrate units from each other.

6. The method as claimed in claim 5, further comprising:
   wire-bonding the chips to the substrate units on which the chips are disposed by a plurality of bonding wires.

7. The method as claimed in claim 5, wherein the conductive film is formed by a process selected from the group consisting of chemical vapor deposition, electroless plating, electrolytic plating, spray coating, printing and sputtering.

8. The method as claimed in claim 5, wherein the conductive film is made of a material selected from the group consisting of aluminum, copper, chromium, stannum, gold, silver and nickel.

9. The method as claimed in claim 5, wherein the shielding conductive blocks are made of a material selected from the group consisting of solder paste and conductive epoxy.

* * * * *